United States Patent
Bhattacharya et al.

(10) Patent No.: US 7,498,860 B2
(45) Date of Patent: Mar. 3, 2009

(54) BUFFER CIRCUIT HAVING MULTIPLEXED VOLTAGE LEVEL TRANSLATION

(75) Inventors: Dipankar Bhattacharya, Macungie, PA (US); Carol A. Huber, Macungie, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/691,590

(22) Filed: Mar. 27, 2007

(65) Prior Publication Data
US 2008/0238399 A1 Oct. 2, 2008

(51) Int. Cl.
*H03L 5/00* (2006.01)
(52) U.S. Cl. .................................. 327/333; 327/407
(58) Field of Classification Search ............... 327/333, 327/407
See application file for complete search history.

(56) References Cited

U.S. PATENT DOCUMENTS 6,480,026 B2 * 11/2002 Andrews et al. .............. 326/39
6,856,173 B1 * 2/2005 Chun .......................... 326/108

* cited by examiner

*Primary Examiner*—Kenneth B. Wells
(74) *Attorney, Agent, or Firm*—Ryan, Mason & Lewis, LLP

(57) ABSTRACT

A buffer circuit is selectively operative in one of at least a first mode and a second mode as a function of a first control signal supplied to the buffer circuit. The buffer circuit includes interface circuitry operative to receive at least second and third control signals referenced to a first voltage level, and to generate an output signal referenced to a second voltage level, the second voltage level being greater than the first voltage level. The output signal is a function of the second control signal in the first mode and is a function of the third control signal in the second mode. The buffer circuit further includes at least first and second circuit portions coupled to the interface circuitry, each of the first and second circuit portions including at least one control input operative to receive the output signal generated by the interface circuitry.

18 Claims, 4 Drawing Sheets

BUFFER CIRCUIT HAVING MULTIPLEXED VOLTAGE LEVEL TRANSLATION

FIELD OF THE INVENTION

The present invention relates generally to electronic circuits, and more particularly relates to bidirectional buffer circuits.

BACKGROUND OF THE INVENTION

Certain portable devices, including wireless handsets, notebook computers and personal digital assistants (PDAs), often employ circuitry which runs on two or more different voltage levels. For instance, circuitry utilized with such portable devices may be configured so that a portion of the circuitry, such as, for example, input/output (IO) buffers, runs at a higher voltage level (e.g., about 3.3 volts), as may be supplied by an IO voltage source, while another portion of the circuitry, such as, for example, core logic, runs at a substantially lower voltage level (e.g., about 1.0 volt), as may be supplied by a core voltage source. This difference in voltage levels often necessitates the use of a voltage level translator circuit for interfacing between the multiple voltage levels.

There are many applications which employ bidirectional buffer circuits including an input stage and an output stage. Some bidirectional buffer circuits utilize programmable control signals (e.g, buffer enable, pull-up, pull-down, etc.) generated, for example, by core logic circuitry that are applied to both the input and output stages of the buffer. Each of these control signals requires voltage level translation, typically by way of a voltage level translator circuit, in order to change the voltage level of the signal from the lower core voltage level to the higher voltage level of the IO driver. Unfortunately, however, each voltage level translator circuit consumes a significant amount of chip area in an integrated circuit device, and therefore the number of voltage level translator circuits in the integrated circuit should be minimized.

Accordingly, there exists a need for an improved buffer circuit that does not suffer from one or more of the problems exhibited by conventional buffer circuits.

SUMMARY OF THE INVENTION

The present invention meets the above-noted need by providing, in an illustrative embodiment thereof, an enhanced buffer circuit having reduced chip area compared to standard buffer circuits. To accomplish this, an embodiment of the invention utilizes multiplexing of two or more control signals supplied to the buffer circuit so as to share a single voltage level translator circuit, thereby utilizing a fewer number of voltage level translator circuits and reducing the overall size of the integrated circuit.

In accordance with an embodiment of the invention, a buffer circuit is selectively operative in one of at least a first mode and a second mode as a function of a first control signal supplied to the buffer circuit. The buffer circuit includes interface circuitry operative to receive at least second and third control signals referenced to a first voltage level, and to generate an output signal referenced to a second voltage level, the second voltage level being greater than the first voltage level. The output signal is a function of the second control signal in the first mode and is a function of the third control signal in the second mode. The buffer circuit further includes at least first and second circuit portions coupled to the interface circuitry, each of the first and second circuit portions including at least one control input operative to receive the output signal generated by the interface circuitry. At least a portion of the buffer circuit may be implemented in an integrated circuit.

The interface circuitry preferably includes at least one voltage level translator circuit operative to receive, as a function of the first control signal, one of at least the second and third control signals, and to generate the output signal. At least one operating characteristic of the first circuit portion may be controllable in the first mode as a function of the second control signal and a least one operating characteristic of the second circuit portion may be controllable in the second mode as a function of the third control signal. Preferably, an operation of the first circuit portion is substantially unaffected by application of the output signal of the voltage level translator circuit to the second circuit portion in the first mode, and an operation of the second circuit portion is substantially unaffected by application of the output signal to the first circuit portion in the second mode.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative voltage level translator and bidirectional buffer circuits. It should be understood, however, that the present invention is not limited to these or any other particular circuit arrangements. Rather, the invention is more generally applicable to techniques for reducing the chip area of a bidirectional buffer circuit. To accomplish this, embodiments of the invention utilize a multiplexing arrangement whereby two or more control signals supplied to the bidirectional buffer circuit share a single voltage level translator circuit, thereby reducing the number of voltage level translator circuits required by the buffer circuit.

Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
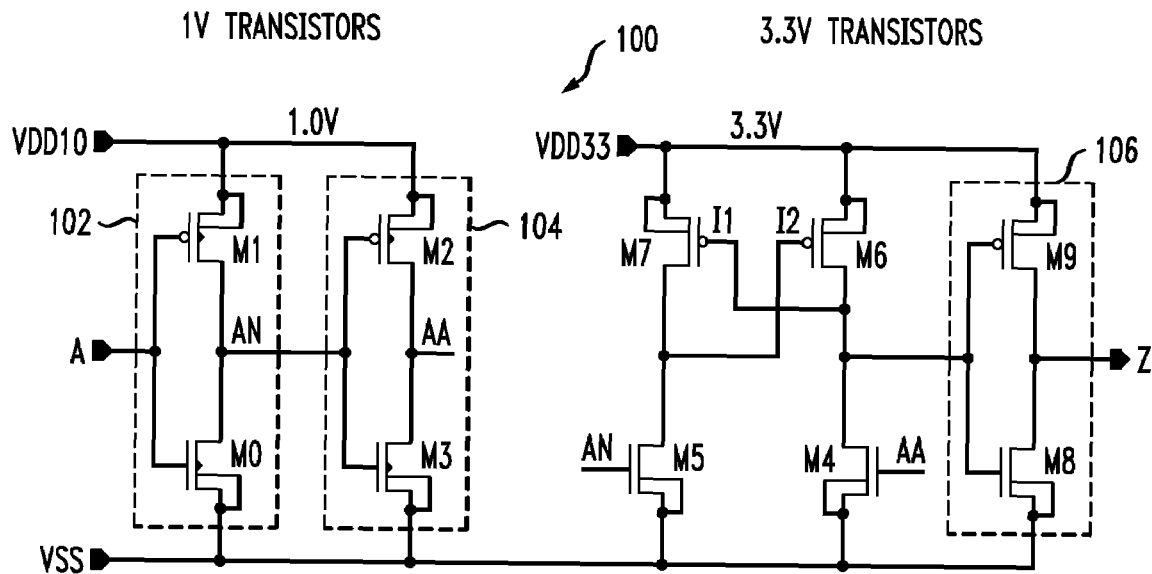
FIG. 1 is a schematic diagram depicting an illustrative voltage level translator circuit which may be used in conjunction with embodiments of the present invention.

FIG. 1 is a schematic diagram depicting at least a portion of an exemplary voltage level translator circuit 100 which can be used to translate input signals (e.g., signal A) referenced to a lower core supply voltage, such as, for example, VDD10, to an output signal Z which is referenced to a higher supply voltage, such as, for example, VDD33. In many applications, the lower core supply voltage VDD10 is typically about 1.0 volt and the higher supply voltage VDD33 is typically about 3.3 volts. It is to be understood, however, that the present invention is not limited to these or to any particular voltage levels for VDD10 and VDD33. Furthermore, the techniques of the present invention may be similarly employed to translate an input signal referenced to the higher supply voltage VDD33 to an output signal referenced to the lower core supply voltage VDD10, with or without modifications to circuit 100, as will be understood by those skilled in the art.

Modern mixed signal integrated circuit processes typically offer two versions of transistors to be fabricated on the same chip, namely, "high voltage" and "low voltage" transistor devices. The low voltage devices, which typically have a very thin gate oxide (e.g., about 15 to about 25 Angstroms), a very short gate length (e.g., about 0.06 to about 0.12 micrometers (µm)), and generally have a nominal threshold voltage of about 0.35 volts, are intended to operate with the lower core supply voltage VDD10 (e.g., about 1.0 volt). The high voltage devices, which typically have much thicker gate oxides and longer gate lengths compared to low voltage devices, and generally have a nominal threshold voltage which is substantially higher than the low voltage devices, such as, for example, about 0.75 volts, are intended to operate with the higher supply voltage VDD33 (e.g., about 3.3 volts). High voltage and low voltage transistor versions are generally offered in both NMOS (n-conductivity) and PMOS (p-conductivity) device types. An advantage of the low voltage transistors is that they offer good performance when used with a lower core supply and are considerably smaller in area compared to high voltage transistors. However, when a voltage substantially higher than the lower core supply (e.g., 3.3 volts) is applied across any of the terminals of a low voltage transistor, severe reliability problems or even device failure will likely occur.

As apparent from the figure, signal AN is a logical inversion of input signal A supplied to circuit 100, such that when signal A is a logic high level, signal AN is a logic low level, and vice versa. Signal AA is a buffered version of input signal A, such that when signal A is a logic high level, signal AA is also a logic high level, and vice versa. Signals AN and AA may be generated, for example, by inverters 102 and 104, respectively. Inverter 102 comprises a low voltage NMOS transistor device M0 and a low voltage PMOS transistor device M1 connected in a conventional manner. Likewise, inverter 104 comprises a low voltage NMOS transistor device M3 and a low voltage PMOS transistor device M2 connected in a conventional manner. An output of inverter 102 is connected to an input of inverter 104. Inverters 102 and 104 are powered by the lower core supply VDD10 and receive, as its negative supply, VSS, or an alternative current return (e.g., ground). Although not required, inverter 104 serves to buffer input signal A and to ensure that rise and fall times of the resulting signal AA are more closely matched to rise and fall times of signal AN. The term "negative voltage supply" as used herein is intended to refer to a value of the voltage supply relative to VDD33 or VDD10, and does not necessarily refer to a voltage less than zero volts, although using a voltage less than zero volts is contemplated by the invention.

The voltage translation portion of voltage level translator circuit 100 is powered by the higher supply voltage VDD33 and receives, as its negative voltage supply, VSS, or an alternative current return. The voltage level translator circuit 100 comprises a pair of high voltage PMOS transistor devices M6 and M7, each device having a source (S) connected to VDD33, and having a gate (G) of one transistor connected to a drain (D) of the other transistor in a cross-coupled arrangement. Specifically, the gate of M7 is connected to the drain of M6 at node i1, and the gate of M6 is connected to the drain of M7 at node i2. Transistors M6 and M7 are operative to latch a logical state of the voltage level translator circuit 100.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

The voltage level translator circuit 100 further comprises a pair of high voltage NMOS transistor devices M4 and MS, each having a gate for receiving one of input signals AA and AN, respectively. Devices M4 and M5 form an input stage of the voltage level translator circuit 100. Sources of M4 and M5 are preferably connected to VSS, and drains of M4 and M5 are connected to the drains of PMOS transistors M6 and M7, respectively. An output stage 106 comprising high voltage PMOS transistor M9 and high voltage NMOS transistor M8 connected together as a standard inverter, is preferably connected to node i1 and generates an output signal Z of the voltage level translator circuit 100.

The basic operation of the voltage level translator circuit 100 is as follows. When input signal A is a logic high ("1") level, and thus signal AA is a logic high level, device M4 is turned on and pulls node i1 to VSS. Input signal AN, being a logical complement of signal A, is a logic low ("0") level, and therefore device M5 will be turned off. Node i1 being at a logic low level turns on device M7, thereby pulling node i2 to VDD33. Node i2 being at a logic high level turns off device M6, and thus the half-latch structure comprising devices M6 and M7 operates in a stable state. Node i1 being low will cause the output Z of the voltage level translator circuit 100 to be a logic high level. Similarly, when input signal A is a logic low level, and thus signal AA is a logic low level, device M4 is turned off. Input signal AN, being a logical complement of signal A, is a logic high level, and therefore device M5 will be turned on, thereby pulling node i2 to VSS. Node i2 being at a logic low level turns on device M6, thereby pulling node i1 to VDD33. Node i1 being at a logic high level turns off device M7. Node i1 being high will cause the output Z of the voltage level translator circuit 100 to be a logic low level.

Using present integrated circuit process technologies, high voltage devices M4 and M5 may turn on very slowly when gated by input signals AA and AN, which are referenced to the core voltage supply VDD10 rather than being referenced to the higher supply VDD33. Accordingly, devices M4 and M5 are preferably sized relatively large (e.g., about 20 µm) in comparison to devices driven by IO level signals referenced to VDV33, which are typically minimum sized devices.

Devices M4 and M5 should be strong enough to "flip" the logic state held by devices M6 and M7, and when transistors M6 and M7 are turned on they have the full 3.3 volts across their respective gate-to-source terminals holding them on. Additional transistors and/or other components may be added to the illustrative voltage level translator circuit 100 to further enhance performance, but such added components will also increase the size of the circuit which is undesirable. It is to be appreciated that voltage level translator circuit 100 is merely illustrative, and that the invention contemplates alternative voltage level translator circuit arrangements, as will become apparent to those skilled in the art.

Figure 2:
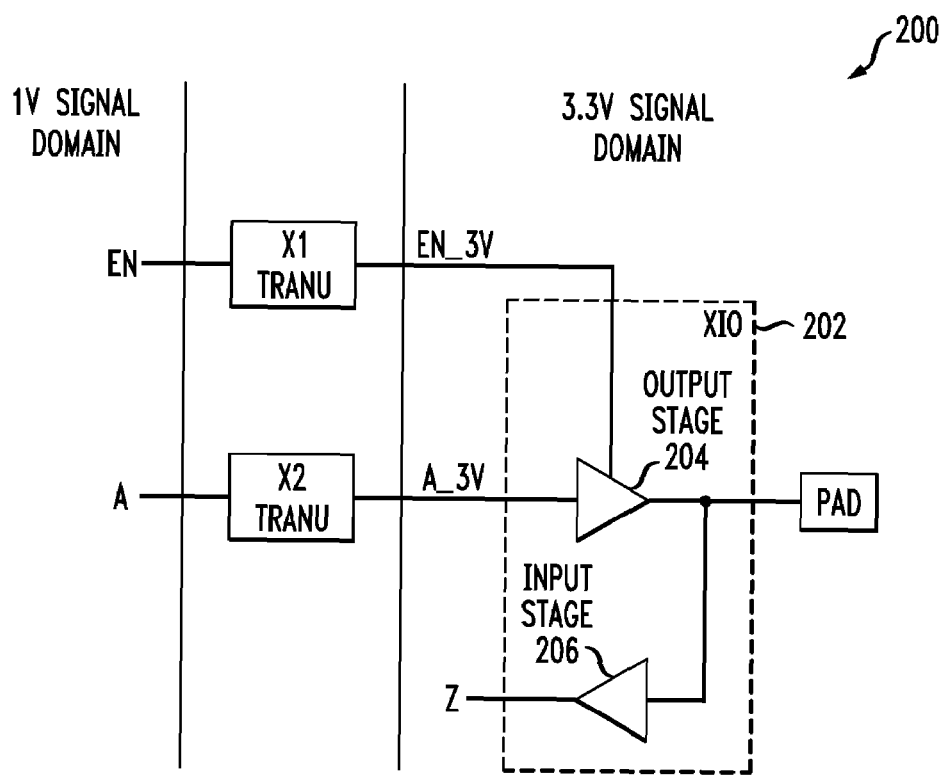
FIG. 2 is a schematic diagram depicting an exemplary bidirectional buffer circuit in which techniques of the present invention may be implemented.

FIG. 2 is a schematic diagram depicting an exemplary bidirectional buffer circuit 200 in which techniques of the present invention may be implemented. Circuit 200 includes an IO buffer 202 comprising an output stage 204 having an input for receiving an input signal, A_3V, supplied to the IO buffer and an output connecting to an IO pad, PAD, and an input stage 206 having an input connecting to the IO pad and an output for generating an output signal, Z, of the IO buffer. The IO pad may be used as an input, an output, or both, and therefore is referred to herein generally as a signal pad, as being more closely indicative of a function thereof.

IO buffer 202 is preferably operative in one of at least two modes. The output stage 204 of IO buffer 202 is preferably operative in a first mode of the IO buffer, which may be an output mode. In this output mode of operation, IO buffer 202 is preferably configured to receive an input signal (e.g., signal A) internal to the chip and to generate an output signal, as a function of the input signal, which is available external to the chip via the IO pad. Likewise, the input stage 206 of IO buffer 202 is preferably operative in a second mode of the IO buffer, which may be an input mode. In this input mode of operation, IO buffer 202 is preferably configured to receive an input signal supplied external to the chip via the IO pad and to generate an output signal (e.g., signal Z), as a function of the externally supplied input signal, which is available internally to the chip. It is to be understood that input stage 206 and output stage 204 may be implemented in the same manner, but used in different modes of operation of the IO buffer 202, as stated above.

As apparent from the figure, circuit 200 may receive signals, for example, input signal A and enable signal EN, which are referenced to a lower core signal domain (e.g., 1.0-volt), but at least a portion of circuit 200, such as IO buffer 202, may be powered by and generate signals (e.g., signal Z) which are referenced to a higher IO signal domain (e.g., 3.3-volt). Consequently, lower core signals EN and A must first be translated to an acceptable voltage level for use by the bidirectional buffer circuit 200.

To accomplish this, buffer circuit 200 preferably includes first and second voltage level translator circuits (TRANU) X1 and X2, respectively. First translator circuit X1 is operative to receive enable signal EN referenced to the lower core signal domain and to generate a translated enable signal, EN_3V, which is referenced to the higher IO signal domain. Likewise, second translator circuit X2 is operative to receive input signal A referenced to the lower core signal domain and to generate a translated input signal, A_3V, which is referenced to the higher IO signal domain. Signals EN_3V and A_3V are preferably of an acceptable voltage level for use by IO buffer 202. Voltage level translator circuit 100 shown in FIG. 1 may be used to implement one or both of translator circuits X1 and X2, although alternative voltage level translator circuits may be similarly employed, as will become apparent to those skilled in the art.

Figure 3:
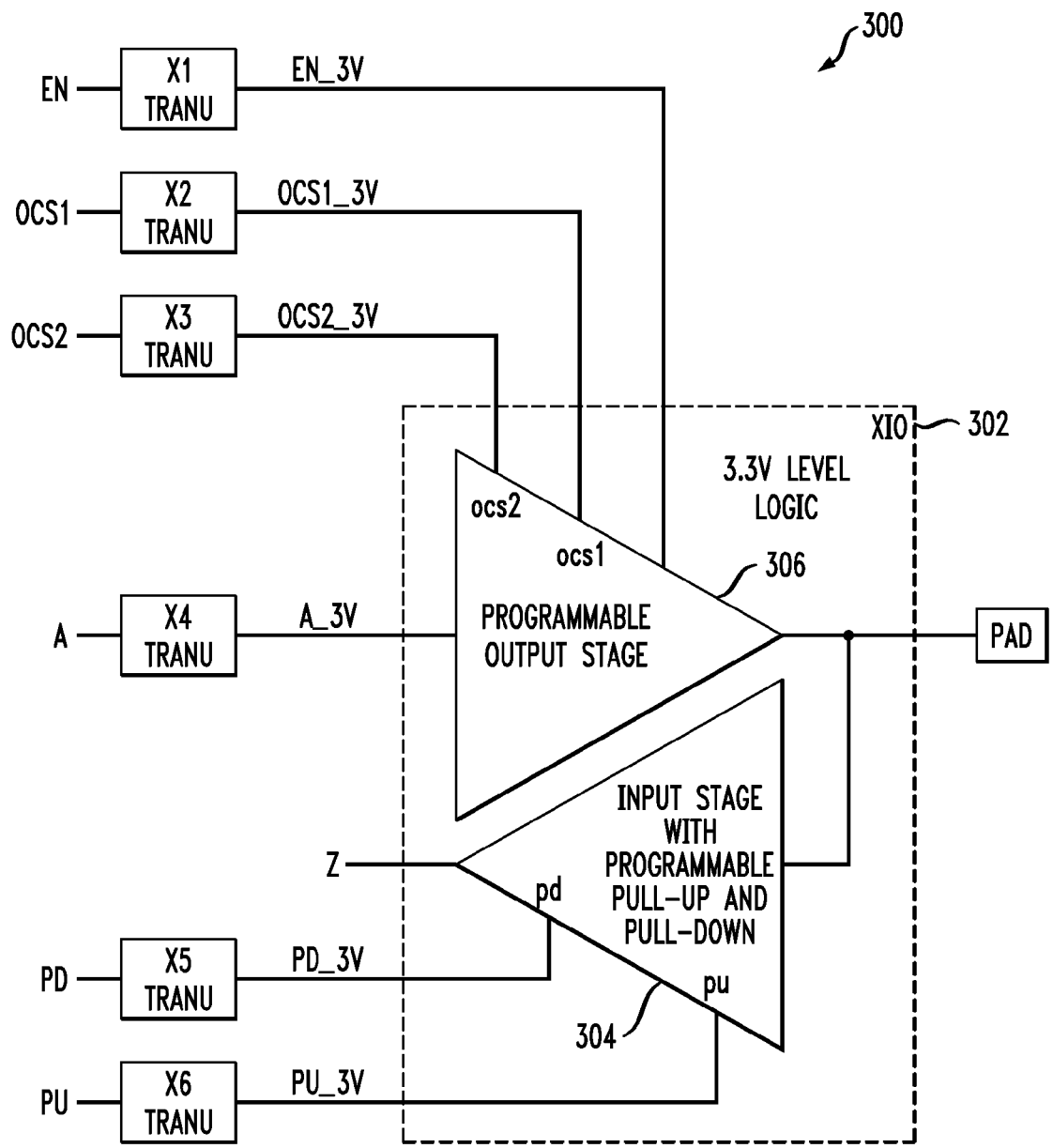
FIG. 3 is a schematic diagram depicting an illustrative bidirectional buffer circuit having programmable input and output stages in which techniques of the present invention may be implemented.

Although bidirectional buffer circuit 200 requires only two voltage level translator circuits X1 and X2, alternative bidirectional buffer circuit arrangements may utilize additional control signals, each additional control signal requiring a voltage level translator circuit corresponding thereto. By way of example only, FIG. 3 depicts at least a portion of an illustrative bidirectional buffer circuit 300 in which techniques of the present invention may be implemented. The buffer circuit 300, like buffer circuit 200 shown in FIG. 2, may be divided into at least two functional circuit portions, namely, an input stage 304 and a programmable output stage 306, although the buffer circuit may comprise other circuitry as well. As apparent from the figure, buffer circuit 300 is more complex compared to buffer circuit 200 shown in FIG. 2 in that buffer circuit 300 utilizes, in addition to enable signal EN and input signal A (utilized by buffer circuit 200), control signals PU, PD, OSC1 and OSC2. It is to be understood that the invention is not limited to any particular number of signals utilized by the bidirectional buffer circuit 300. IO buffer 302 operates in a higher IO signal domain (e.g., 3.3-volt), similar to IO buffer 202 depicted in FIG. 2, and signals EN, OSC1, OSC2, A, PD and PU are typically generated by core logic circuitry operating in a lower core signal domain (e.g., 1.0-volt).

Programmable output stage 306 may be operative in one of four different logic states controlled by signals OSC1 and OSC2. These states may represent different operating characteristics of output stage 306, such as, for example, different output impedances, slew rates, etc. For a programmable output stage that is operative in more than four logic states (e.g., 8), a greater number of control signals (e.g., 3) is required. Likewise, input stage 304 may include programmable pull-up and pull-down devices. These pull-up and pull-down devices may comprise, for example, high impedance (e.g., about 50 kilo (K) ohms or higher) resistors, or alternative resistance elements (e.g., MOS device), that are controlled by signals PU and PD, respectively. When PU is a logic high and PD is a logic low, the pull-up resistor is preferably enabled; when PU is a logic low and PD is a logic high, the pull-down resistor is preferably enabled; and when both PU and PD are high neither resistor is enabled. The use of pull-up and pull-down resistors is often necessary in order to place input stage 304 in a known state when output stage 306 is in a high impedance state and no other buffer is driving the PAD node.

As stated above, signals EN, OSC1, OSC2, A, PD and PU are typically generated by low voltage core logic circuitry and must therefore be level translated for use with IO buffer 302, which typically operates in a higher IO signal domain. Accordingly, bidirectional buffer circuit 300 further includes multiple voltage level translator circuits (TRANU) X1, X2, X3, X4, X5 and X6. Voltage level translator circuit X1 is operative to receive enable signal EN referenced to the lower core voltage supply and to generate a translated enable signal EN_3V which is referenced to the higher IO voltage supply. Likewise, voltage level translator circuit X2 is operative to receive control signal OSC1 referenced to the lower core voltage supply and to generate a translated control signal OSC1_3V which is referenced to the higher IO voltage supply; voltage level translator circuit X3 is operative to receive control signal OSC2 referenced to the lower core voltage supply and to generate a translated control signal OSC2_3V which is referenced to the higher IO voltage supply; voltage level translator circuit X4 is operative to receive input signal A referenced to the lower core voltage supply and to generate a translated input signal A_3V which is referenced to the higher IO voltage supply; voltage level translator circuit X5 is operative to receive control signal PD referenced to the lower core voltage supply and to generate a translated control signal PD_3V which is referenced to the higher IO voltage supply; and voltage level translator circuit X6 is operative to receive control signal PU referenced to the lower core voltage supply and to generate a translated control signal PU_3V which is referenced to the higher IO voltage supply.

Unfortunately, however, because of the relatively large number of signals employed by IO buffer 302 and the corresponding voltage level translator circuits X1 through X6 that are required, the size of buffer circuit 300 will be relatively large in comparison to buffer circuits which utilize a smaller number of control signals. In accordance with an aspect of the invention, in order to reduce the number of voltage level translator circuits required by buffer circuit 300, and thus reduce the overall size of the buffer circuit, two or more control signals may be advantageously multiplexed so as to share a single voltage level translator circuit.

To accomplish this, embodiments of the invention exploit the notion that certain signals which have an effect on one or more portions the IO buffer 302 during a first mode of operation of the buffer circuit 300 have substantially no effect on one or more other portions of the IO buffer during a second mode of operation of the buffer circuit. Moreover, since the IO buffer 302 is not utilized as both an input buffer and an output buffer concurrently, only the input stage 304 or the output stage 306 is active at any given time. When inactive, the respective logic states of the signals presented to a given input or output stage in the IO buffer are effectively irrelevant. For example, signals OCS1 and OCS2 which are used to control a logic state of output stage 306 have no significant effect on the output stage if applied to the pull-down (pd) and pull-up (pu) control inputs of input stage 304 when the IO buffer is operative in an output mode. When enabled, output stage 306 is preferably configured to drive the PAD node regardless of the state of the pull-up and pull-down devices in the input stage 304. Likewise, signals PU and PD which are used to control pull-up and pull-down devices, respectively, in input stage 304 have substantially no effect on the input stage if applied to the control inputs, ocs1 and ocs2, of output stage 306 when the output stage is disabled (e.g., when IO buffer 302 is in an input mode).

Figure 4:
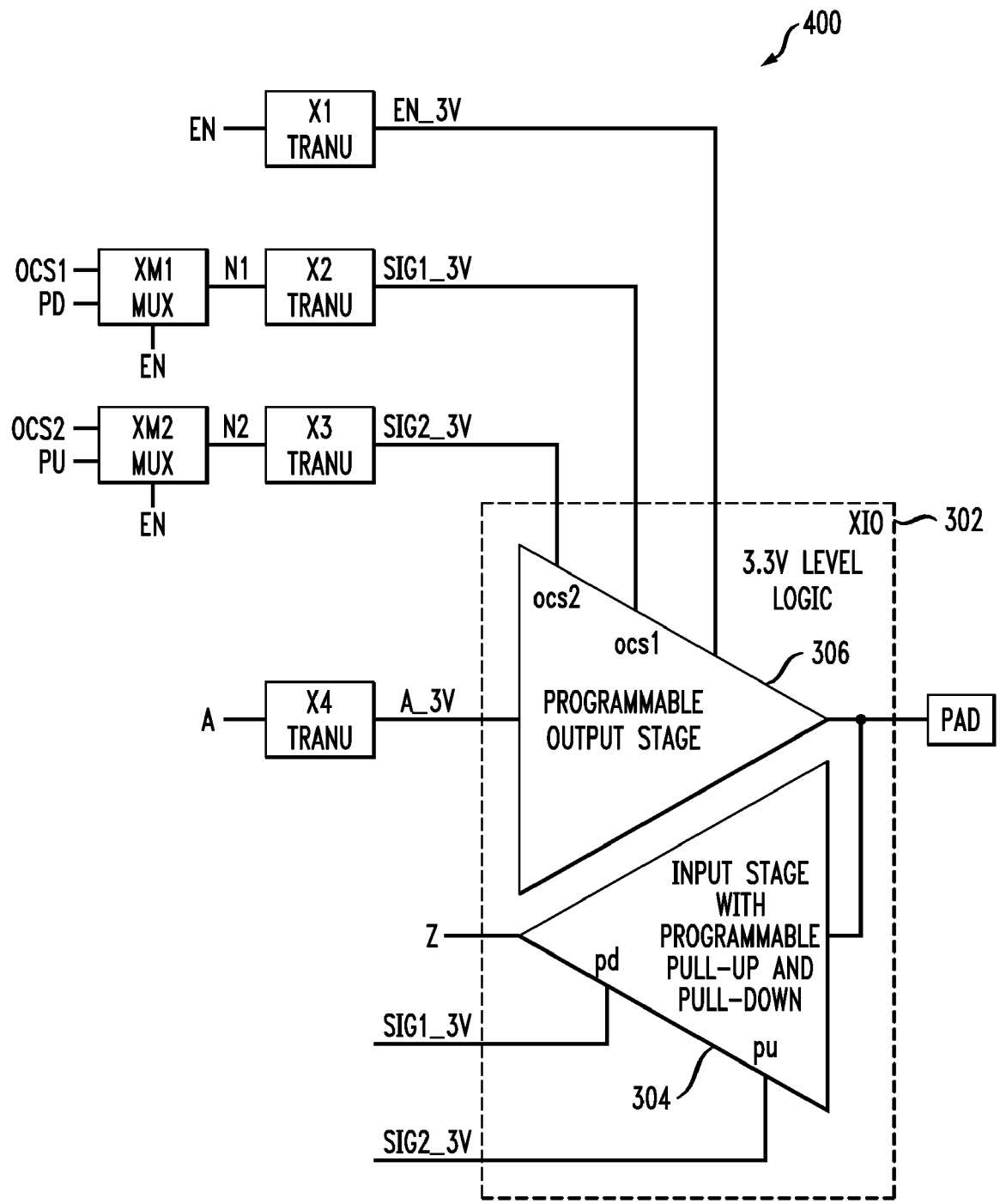
FIG. 4 is a schematic diagram depicting at least a portion of an exemplary bidirectional buffer circuit, formed in accordance with an embodiment of the present invention.

FIG. 4 is a schematic diagram depicting at least a portion of an exemplary bidirectional buffer circuit 400, formed in accordance with an embodiment of the present invention. Although not required, buffer circuit 400 may be similar to buffer circuit 300 shown in FIG. 3, with one exception being that buffer circuit 400 has fewer voltage level translator circuits for the same number of signals presented to the buffer circuit. Specifically, buffer circuit 400 preferably includes an IO buffer 302 which is divided into two functional sub-circuits, namely, an input stage 304 and a programmable output stage 306, although the buffer circuit may comprise other circuitry in place of or in addition to the input and output stages. As previously stated, IO buffer 302 operates in a higher IO signal domain (e.g., 3.3-volt) and signals EN, OSC1, OSC2, A, PD and PU supplied to the buffer circuit 400 are typically generated by core logic circuitry operating in a lower core signal domain (e.g., 1.0-volt). Advantageously, although buffer circuit 400 is operative to receive six signals, namely, signals EN, OSC1, OSC2, A, PD and PU, buffer circuit 400 includes only four voltage level translator circuits (TRANUs), X1, X2, X3 and X4, whereas buffer circuit 300 depicted in FIG. 3 requires six voltage level translator circuits. It is to be appreciated, however, that the invention is not limited to any particular number of voltage level translator circuits or signals presented to the buffer circuit.

Voltage level translator circuit X1 is operative to receive enable signal EN referenced to the lower core voltage supply and to generate a translated enable signal EN_3V which is referenced to the higher IO voltage supply. Likewise, voltage level translator circuit X4 is operative to receive input signal A referenced to the lower core voltage supply and to generate a translated input signal A_3V which is referenced to the higher IO voltage supply. Thus, voltage level translator circuits X1 and X4 preferably function in a manner consistent with that described above in connection with FIG. 3. Voltage level translator circuits X2 and X3 are each operative to receive one of two or more multiplexed signals to thereby reduce the number of voltage level translator circuits required by buffer circuit 400.

Specifically, buffer circuit 400 includes first and second multiplexers (MUXs), XM1 and XM2, respectively, or alternative control circuitry. Although not explicitly shown, one or both multiplexers may comprise at least one pass gate (e.g., NMOS and/or PMOS device) connected in a conventional fashion, as will be understood by those skilled in the art. The multiplexers are typically significantly smaller in size compared to the voltage level translator circuits, which results in a beneficial reduction in chip area of buffer circuit 400. Although XM1 and XM2 are depicted as two-input multiplexers, the invention is not limited to multiplexers of any particular number of inputs; nor is the invention limited to any particular number of multiplexers. It is to be understood that in applications involving more complex programmable bidirectional buffer circuit arrangements employing additional control signals, additional multiplexers and/or multiplexers having more than two inputs may be utilized. Multiplexers XM1 and XM2, in conjunction with voltage level translator circuits X1 through X4 preferably form at least a portion of interface circuitry included in buffer circuit 400.

First multiplexer XM1 is preferably operative to receive signals OSC1 and PD referenced to the lower core voltage supply and to generate an output signal, N1, also referenced to the lower core supply. Signals OSC1 and PD are preferably employed by buffer circuit 400 in mutually exclusive modes of operation of the buffer circuit. Output signal N1, which is either signal OSC1 or signal PD (or a respective signal indicative thereof) depending on the logical state of at least one control signal supplied to a control input of XM1, is then translated by voltage level translator circuit X2 to generate a translated control signal SIG1_3V which is referenced to the higher IO voltage supply. Similarly, second multiplexer XM2 is operative to receive signals OSC2 and PU referenced to the lower core voltage supply and to generate an output signal, N2, also referenced to the lower core supply. Signals OSC2 and PU are preferably employed by buffer circuit 400 in mutually exclusive modes of operation of the buffer circuit. Output signal N2, which is either signal OSC2 or signal PU (or a respective signal indicative thereof) depending on the logical state of at least one control signal supplied to a control input of XM2, is then translated by voltage level translator circuit X3 to generate translated control signal SIG2_3V which is referenced to the higher IO voltage supply.

As apparent from the figure, enable signal EN is preferably used as the control signal for multiplexers XM1 and XM2, although an alternative control signal may be employed. It is convenient to use the enable signal EN since this signal is already employed by the buffer circuit 400 to control a mode of operation of the buffer circuit. For example, when signal EN is a logic high level, IO buffer 302 will preferably be operative in an output mode functioning as an output buffer, with output stage 306 being enabled. Conversely, when signal EN is a logic low level, IO buffer 302 is preferably operative in an input mode functioning as an input buffer, with output stage 306 being disabled (e.g., in a high-impedance state).

When used as an output buffer, control signals OSC1 and OSC2 are utilized to select the state of the output stage 306, as previously explained. Therefore, when signal EN is high, multiplexers XM1 and XM2 are preferably configured such that signals OSC1 and OSC2 are selected as the output signals N1 and N2, respectively.

The voltage level translated signals SIG1_3V and SIG2_3V are fed to both input stage 304 and output stage 306. However, when the IO buffer 302 is used in the output mode, the output signal Z generated by the input stage 304 is not used, and therefore these control signals SIG1_3V and SIG2_3V, when applied to the pd and pu control inputs, respectively, of the IO buffer, will have essentially no effect. When used in the input mode, control signals PD and PU are utilized by the IO buffer 302 to control the pull-down and pull-up devices, respectively, in input stage 304, as previously stated. Therefore, when signal EN is low, multiplexers XM1 and XM2 are preferably configured such that signals PD and PU are selected as the output signals N1 and N2, respectively. The voltage level translated signals SIG1_3V and SIG2_3V are fed to both input stage 304 and output stage 306. However, when IO buffer 302 is used in the output mode, output stage 306 is disabled, and therefore these control signals SIG1_3V and SIG2_3V which drive the pull-up and pull-down devices, respectively, in input stage 304 will have essentially no effect on output stage 306. If there are other signals in addition to the EN signal that are utilized in controlling the enable function of IO buffer 302, the effective logical combination (e.g., logical AND, OR, etc.) of these signals can be used as the control signal for the multiplexers XM1 and XM2.

Variations of this multiplexing technique are contemplated. For example, in accordance with other illustrative embodiments of the invention, the bidirectional buffer circuit may include a circuit operative to drive pull-up and pull-down nodes in the input stage low while the IO buffer is operative in the output mode. This will ensure minimal leakage current in output mode. Additionally, although shown as separate functional blocks, one or more functional blocks in buffer circuit 400 may be combined, either with one another or with one or more other functional blocks.

Figure 5:
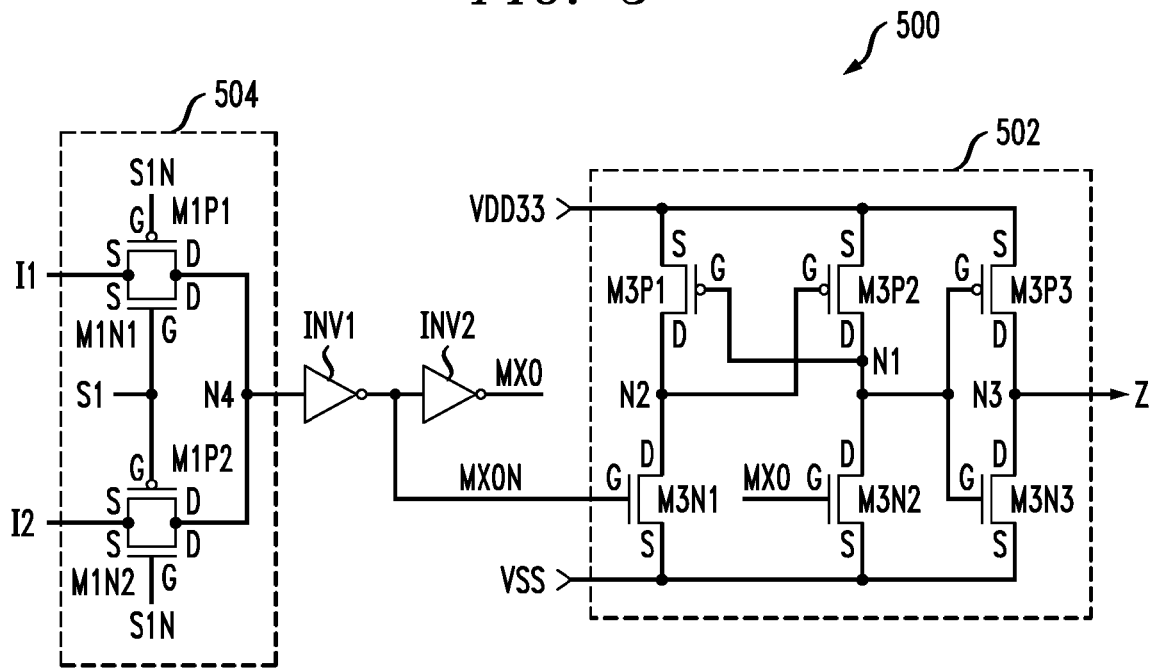
FIG. 5 is a schematic diagram depicting at least a portion of an exemplary voltage level translator circuit including multiplexed inputs, formed in accordance with another embodiment of the invention.

By way of example, FIG. 5 is a schematic diagram depicting at least a portion of an illustrative voltage level translator circuit 500 including multiplexed inputs, formed in accordance with another embodiment of the invention. Voltage level translator circuit 500 includes core voltage level translation circuitry 502 which is powered by a higher supply voltage (e.g., 3.3 volts), which may be VDD33, and receives, as its negative voltage supply, VSS, or an alternative current return (e.g., ground). Voltage level translation circuitry 502 may be implemented in a manner consistent with voltage level translator circuit 100 shown in FIG. 1.

Voltage level translation circuitry 502 preferably comprises a pair of high voltage PMOS transistor devices, M3P1 and M3P2, connected in a cross-coupled configuration. Specifically, sources of M3P1 and M3P2 are connected to VDD33, a gate of M3P1 is connected to a drain of M3P2 at node N1, and a gate of M3P2 is connected to a drain of M3P1 at node N2. Voltage level translation circuitry 502 further includes an input stage comprising a pair of high voltage NMOS transistor devices, M3N1 and M3N2, each device having a gate for receiving one of input multiplexed signals MXON and MXO, respectively. Sources of devices M3N1 and M3N2 are preferably connected to VSS, and drains of M3N1 and M3N2 are connected to the drains of PMOS transistors M3P1 and M3P2, respectively. An output stage comprising high voltage PMOS transistor M3P3 and high voltage NMOS transistor M3N3 connected together as a standard inverter, is preferably connected to node N1 and generates an output signal Z of the voltage level translator circuitry 502 at node N3.

Voltage level translator circuit 500 further includes a multiplexer 504 which is operative to receive at least two signals, I1 and I2, that are supplied to the circuit and to select, as an output of the multiplexer at node N4, one of signals I1 and I2 as a function of a control signal, S1, presented to the voltage level translator circuit. Multiplexer 504 preferably comprises a pair of complementary pass gates. A first pass gate includes a first low voltage PMOS transistor device M1P1 and a first low voltage NMOS transistor device M1N1 connected in parallel with one another. Sources of M1P1 and M1N1 are connected together and form a first input of the voltage level translator circuit 500 for receiving signal I1, drains of M1P1 and M1N1 are connected together at node N4, a gate of M1N1 receives control signal S1, and a gate of M1P1 receives signal S1N, a logical complement of signal S1. Likewise, a second pass gate includes a second low voltage PMOS transistor device M1P2 and a second low voltage NMOS transistor device M1N2 connected in parallel with one another. Sources of M1P2 and M1N2 are connected together and form a second input of the voltage level translator circuit 500 for receiving signal I2, drains of M1P2 and M1N2 are connected together at node N4, a gate of M1N2 receives control signal S1N, and a gate of M1P2 receives signal S1.

When control signal S1 is a logic high level, the first pass gate will be enabled and signal I1 will be generated as the output of multiplexer 504 at node N4; the second pass gate will be disabled. The output signal from multiplexer 504 will also be referenced to the lower core supply. When signal S1 is a logic low level, the second pass gate will be enabled and signal I2 will be generated as the output of multiplexer 504 at node N4; the first pass gate will be disabled. The input signal MXO, and its logical complement signal MXON, are generated by a pair of inverters, INV2 and INV1, respectively. Signal MXO is essentially a buffered version of the output of multiplexer 504 at node N4.

Figure 6:
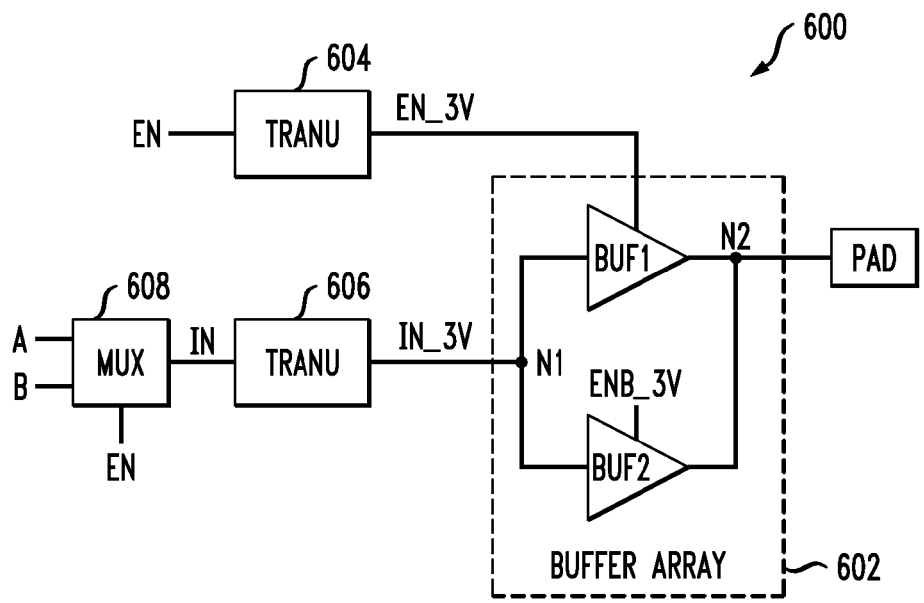
FIG. 6 is a schematic diagram depicting at least a portion of an exemplary buffer circuit, formed in accordance with another embodiment of the present invention.

FIG. 6 is a schematic diagram depicting at least a portion of an exemplary buffer circuit 600, formed in accordance with another embodiment of the invention. In this illustrative embodiment, buffer circuit 600 includes an output buffer array 602 which essentially replaces the IO buffer 302 in buffer circuit 400 shown in FIG. 4. The output buffer array 602 in buffer circuit 600 comprises first and second output buffers, BUF1 and BUF2, respectively, although this embodiment of the invention is not limited to the particular number of buffers shown. The output buffers BUF1 and BUF2 are connected together in parallel, such that an input of first output buffer BUF1 is connected to an input of second output buffer BUF2 at node N1, and an output of BUF1 is connected to an output of BUF2 at node N2. Buffers BUF1 and BUF2 may be the same or different. For example, buffer BUF1 may have a greater output drive capability compared to buffer BUF2.

Buffers BUF1 and BUF2 are preferably configured such that when one buffer is enabled, the other is disabled (e.g., tri-stated) as a function of an enable signal, EN, or other control signal, supplied to the buffer circuit 600. Specifically, in a first mode of operation of buffer array 602, output buffer BUF1 is enabled and output buffer BUF2 is disabled. In a second mode of operation of the buffer array 602, BUF2 is enabled and BUF1 is disabled. First output buffer BUF1 receives an enable signal, EN_3V, and second output buffer BUF2 receives a logical complement of the enable signal, namely, signal ENB_3V. When signal EN_3V is a logic high level, BUF1 is preferably enabled. Signal ENB_3V, being a logical complement of signal EN_3V, will be a logic low level, thereby BUF2 will be disabled, such as, for example, by placing the output of BUF2 in a high-impedance state (e.g., tri-state). When disabled, the output of BUF2 is preferably unaffected by signals applied to the input of BUF2. Conversely, when signal EN_3V is a logic low level, BUF1 is disabled, such as, for example, by placing the output of BUF1 in a high-impedance state (e.g., tri-state). Signal ENB_3V, being a logical complement of signal EN_3V, will be a logic high level, thereby enabling BUF2. When disabled, the output of BUF1 is preferably unaffected by signals applied to the input of BUF1.

Each of the output buffers BUF1 and BUF2 are preferably connected to an IO voltage supply and are therefore operative in a higher IO signal domain (e.g., 3.3-volt). However, as in the case of the buffer circuits described above, buffer circuit 600 is operative to receive signals, namely, signals A, B and EN, that are referenced to a core voltage supply, as may be generated by core logic, in a lower core signal domain (e.g., 1.0-volt). Consequently, these signals require voltage level translation to be compatible for use with output buffer array 602. Accordingly, buffer circuit 600 includes a first voltage level translator circuit (TRANU) 604 operative to receive the enable signal EN and to generate signal EN_3V, which is a voltage level-translated signal corresponding to signal EN. Voltage level translator circuit 604 may be implemented as shown in FIG. 1 and described above, although alternative voltage level translator circuit arrangements may be employed, as will be apparent to those skilled in the art. Buffer circuit 600 further includes a second voltage level translator circuit 606 that is operative to receive a signal, IN, which corresponds to one of input signals A and B referenced to the lower core supply, and to generate signal IN_3V, which is a voltage level-translated signal corresponding to signal IN. Although shown as being implemented using the same voltage level translator circuit, namely, TRANU, voltage level translator circuits 604 and 606 may be different.

A multiplexer (MUX) 608 included in buffer circuit 600 is preferably operative to receive input signals A and B referenced to the lower core voltage supply and to select, as an output of the MUX, one of input signals A and B as a function of a control signal supplied to the MUX. In this illustrative buffer circuit 600, the control signal applied to MUX 608 is preferably the enable signal EN used for selectively controlling the mode of operation of buffer array 602. Using this multiplexing arrangement, a voltage level translator circuit can be eliminated, thereby beneficially reducing the area required by buffer circuit 600. This unique multiplexing technique can be expanded, in accordance with other embodiments of the invention, to provide further beneficial reductions in chip area for more complex buffer circuits At least a portion of the bidirectional buffer circuit of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A buffer circuit selectively operative in one of at least a first mode and a second mode as a function of a first control signal supplied to the buffer circuit, the buffer circuit comprising:
   interface circuitry operative to receive at least second and third control signals referenced to a first voltage level, and to generate an output signal referenced to a second voltage level, the second voltage level being greater than the first voltage level, the output signal being a function of the second control signal in the first mode and being a function of the third control signal in the second mode; and
   first and second circuit portions coupled to the interface circuitry, each of the first and second circuit portions including at least one control input operative to receive the output signal generated by the interface circuitry;
   wherein the interface circuitry comprises at least one voltage level translator circuit operative to receive, as a function of the first control signal, one of at least the second and third control signals, and to generate the output signal, the output signal of the voltage level translator circuit having a value indicative of the second control signal in the first mode of operation and having a value indicative of the third control signal in the second mode of operation.

2. The circuit of claim 1, wherein at least one operating characteristic of the first circuit portion is controllable in the first mode as a function of the second control signal and at least one operating characteristic of the second circuit portion is controllable in the second mode as a function of the third control signal, an operation of the first circuit portion being substantially unaffected by application of the output signal to the second circuit portion in the first mode, an operation of the second circuit portion being substantially unaffected by application of the output signal to the first circuit portion in the second mode.

3. The circuit of claim 1, further comprising at least one multiplexer connected to the at least one voltage level translator circuit, the multiplexer being operative to receive at least the second and third control signals, and to select, as an output of the multiplexer, one of the second and third control signals as a function of the first control signal.

4. The circuit of claim 3, wherein the multiplexer comprises first and second pass gates, the first pass gate including a first terminal for receiving the second control signal, a second terminal for receiving the first control signal, and a third terminal, the second pass gate including a first terminal for receiving the third control signal, a second terminal for receiving a logical complement of the first control signal, and a third terminal connected to the third terminal of the first pass gate and forming an output of the multiplexer.

5. The circuit of claim 1, wherein the at least one voltage level translator circuit comprises:
   an input stage for receiving, as an input signal, one of at least the second and third control signals referenced to the first voltage level; and
   a latch circuit coupled to the input stage and operative to store a signal representative of a logic state of the input signal.

6. The circuit of claim 1, wherein the at least one voltage level translator circuit comprises:
   at least a first inverter including at least one MOS transistor device having a first threshold voltage associated therewith, the first inverter being operative to receive, as an input signal, one of at least the second and third control signals referenced to the first voltage level, and to generate, as an output of the first inverter, a logical complement of the input signal;

a latch circuit comprising a first pair of MOS transistor devices of a first conductivity type and having a second threshold voltage associated therewith, the second threshold voltage being greater than the first threshold voltage, the first pair of MOS devices being connected in a cross-coupled configuration, the latch circuit being operative to store a signal representative of a logic state of the input signal; and an input stage comprising a second pair of MOS transistors of a second conductivity type and having the second threshold voltage associated therewith, the input stage being connected to the latch circuit and being operative to receive the input signal and logical complement of the input signal.

7. The circuit of claim 1, wherein the first circuit portion comprises an output stage and the second circuit portion comprises an input stage.

8. The circuit of claim 1, further comprising a signal pad connected to an output of the first circuit portion and to an input of the second circuit portion, the first circuit portion being at least partially disabled in the first mode and being operative in the second mode to drive the signal pad.

9. The circuit of claim 1, wherein the at least one function of the first circuit portion comprises at least one of output impedance and slew rate of the first circuit portion.

10. The circuit of claim 1, wherein the at least one function of the second circuit portion comprises at least one of a state of a pull-down device and a state of a pull-up device in the second circuit portion.

11. The circuit of claim 1, wherein the first voltage level is nominally about 1.0 volt and the second voltage level is nominally about 3.3 volts.

12. A buffer circuit selectively operative in one of at least a first mode and a second mode as a function of a first control signal supplied to the buffer circuit, the buffer circuit comprising:

interface circuitry operative to receive at least second and third control signals referenced to a first voltage level, and to generate an output signal referenced to a second voltage level, the second voltage level being greater than the first voltage level, the output signal being a function of the second control signal in the first mode and being a function of the third control signal in the second mode; and first and second circuit portions coupled to the interface circuitry, each of the first and second circuit portions including at least one control input operative to receive the output signal generated by the interface circuitry;

wherein the first circuit portion comprises a first output buffer and the second circuit portion comprises a second output buffer, the first and second output buffers being connected in parallel with one another and having different characteristics associated therewith relative to one another.

13. An integrated circuit including at least one buffer circuit selectively operative in one of at least a first mode and a second mode as a function of a first control signal supplied to the buffer circuit, the at least one buffer circuit comprising:

interface circuitry operative to receive at least second and third control signals referenced to a first voltage level, and to generate an output signal referenced to a second voltage level, the second voltage level being greater than the first voltage level, the output signal being a function of the second control signal in the first mode and being a function of the third control signal in the second mode; and first and second circuit portions coupled to the interface circuitry, each of the first and second circuit portions including at least one control input operative to receive the output signal generated by the interface circuitry;

wherein the interface circuitry comprises at least one voltage level translator circuit operative to receive, as a function of the first control signal, one of at least the second and third control signals, and to generate the output signal, the output signal of the voltage level translator circuit having a value indicative of the second control signal in the first mode of operation and having a value indicative of the third control signal in the second mode of operation.

14. The integrated circuit of claim 13, wherein at least one operating characteristic of the first circuit portion is controllable in the first mode as a function of the second control signal and a least one operating characteristic of the second circuit portion is controllable in the second mode as a function of the third control signal, an operation of the first circuit portion being substantially unaffected by application of the output signal to the second circuit portion in the first mode, an operation of the second circuit portion being substantially unaffected by application of the output signal to the first circuit portion in the second mode.

15. The integrated circuit of claim 13, further comprising at least one multiplexer connected to the at least one voltage level translator circuit, the multiplexer being operative to receive at least the second and third control signals, and to select, as an output of the multiplexer, one of the second and third control signals as a function of the first control signal.

16. The integrated circuit of claim 15, wherein the multiplexer comprises first and second pass gates, the first pass gate including a first terminal for receiving the second control signal, a second terminal for receiving the first control signal, and a third terminal, the second pass gate including a first terminal for receiving the third control signal, a second terminal for receiving a logical complement of the first control signal, and a third terminal connected to the third terminal of the first pass gate and forming an output of the multiplexer.

17. The integrated circuit of claim 13, wherein the at least one voltage level translator circuit comprises:

an input stage for receiving, as an input signal, one of at least the second and third control signals referenced to the first voltage level; and a latch circuit coupled to the input stage and operative to store a signal representative of a logic state of the input signal.

18. The integrated circuit of claim 13, further comprising a signal pad connected to an output of the first circuit portion and to an input of the second circuit portion, the first circuit portion being at least partially disabled in the first mode and being operative in the second mode to drive the signal pad.

* * * * *